United States Patent [19]
Gillette et al.

[11] Patent Number: 5,928,001
[45] Date of Patent: Jul. 27, 1999

[54] SURFACE MOUNTABLE FLEXIBLE INTERCONNECT

[75] Inventors: Joseph G. Gillette, Margate; Scott Potter, Coconut Creek; Pradeep Lall, Sunrise, all of Fla.

[73] Assignee: Motorola, Inc., Schaumburg, Ill.

[21] Appl. No.: 08/925,157

[22] Filed: Sep. 8, 1997

[51] Int. Cl.$^6$ ............................................ H01R 9/09
[52] U.S. Cl. ........................................ 439/67; 439/496
[58] Field of Search ............................. 439/495, 496, 439/67

[56] References Cited

U.S. PATENT DOCUMENTS

| | | | |
|---|---|---|---|
| 4,367,006 | 1/1983 | Rehbogen, Jr. et al. | 439/495 |
| 5,097,101 | 3/1992 | Trobough | 439/67 |
| 5,430,614 | 7/1995 | Difrancesco | 439/67 |
| 5,433,632 | 7/1995 | Cherney et al. | 439/495 |
| 5,742,484 | 4/1998 | Gillette et al. | 439/496 |

Primary Examiner—Paula Bradley
Assistant Examiner—Katrina Davis
Attorney, Agent, or Firm—Dale W. Dorinski

[57] ABSTRACT

A surface mountable flexible interconnect (100) for connecting two electronic subassemblies is constructed from a flexible film substrate (110). Conductive metal runners (120) run along the bottom surface (114) of the substrate and connect an array of solder pads (122), each having an attached solder bump (123), to a second terminal portion (124) located at the second end of the substrate. A rigid sheet of printed circuit board material (130), attached to the top surface of the substrate using a strong adhesive (142), lies directly above the array of solder pads and acts as stress relief mechanism. A slightly tacky temporary adhesive (140) is used to attach the second end of the substrate to the topside (132) of the rigid sheet.

17 Claims, 5 Drawing Sheets

SURFACE MOUNTABLE FLEXIBLE INTERCONNECT

TECHNICAL FIELD

This invention relates in general to printed circuit board connectors, and more specifically, to a surface mountable flexible connector.

BACKGROUND

The challenge of making a low cost, reliable interconnection between electronic subassemblies such as printed circuit boards is not new. The literature is replete with novel and interesting solutions to the problem. Unfortunately, the perfect interconnect has not been invented, and the need remains for better interconnect solutions for a variety of applications.

The most common applications involve connectors for electrically bridging individual printed circuit boards (PCBs). Traditionally, the connection of closely-stacked parallel PCBs has been achieved with rigid connectors. These are typically made of two mating halves, a male and a female, each having leads to attach to the PCB and receptacles captured in a rigid housing. One advantage of rigid connectors is that the various halves of the connectors are easily surface mountable and some degree of automation can be employed when they are attached to the PCB. However, they often require manual processes to mate the two PCBs to each other, and they are susceptible to mechanical failure due to stress induced by tolerance stackup or by mechanical shock when dropped onto a surface. Some have sought to overcome these problems by creating a flexible interconnection between the two PCBs. This is typically achieved by plugging a flexible circuit into a connector which is mounted on the PCB. While this solves the stress problem in the assembly, a rigid connector still exists on each PCB and additional parts are required. In addition, flexible circuits do not lend themselves well to automated assembly. A novel solution, found in previously filed, commonly owned application number 08/801612 provides a flexible interconnect assembly for interconnection of adjacent PCBs on a common manufacturing line which overcomes the limitations of the prior art.

However, a need still exists for a surface mountable flexible interconnect which is not limited to PCB-to-PCB interconnection applications. Furthermore, the need exists for a flexible interconnect which is amenable to manufacturing environments in which two subassemblies requiring interconnection do not share a common manufacturing line (i.e., where the two subassemblies are never situated side-by-side during manufacturing operations).

DETAILED DESCRIPTION OF THE PREFERRED EMBODIMENT

Figure 1:
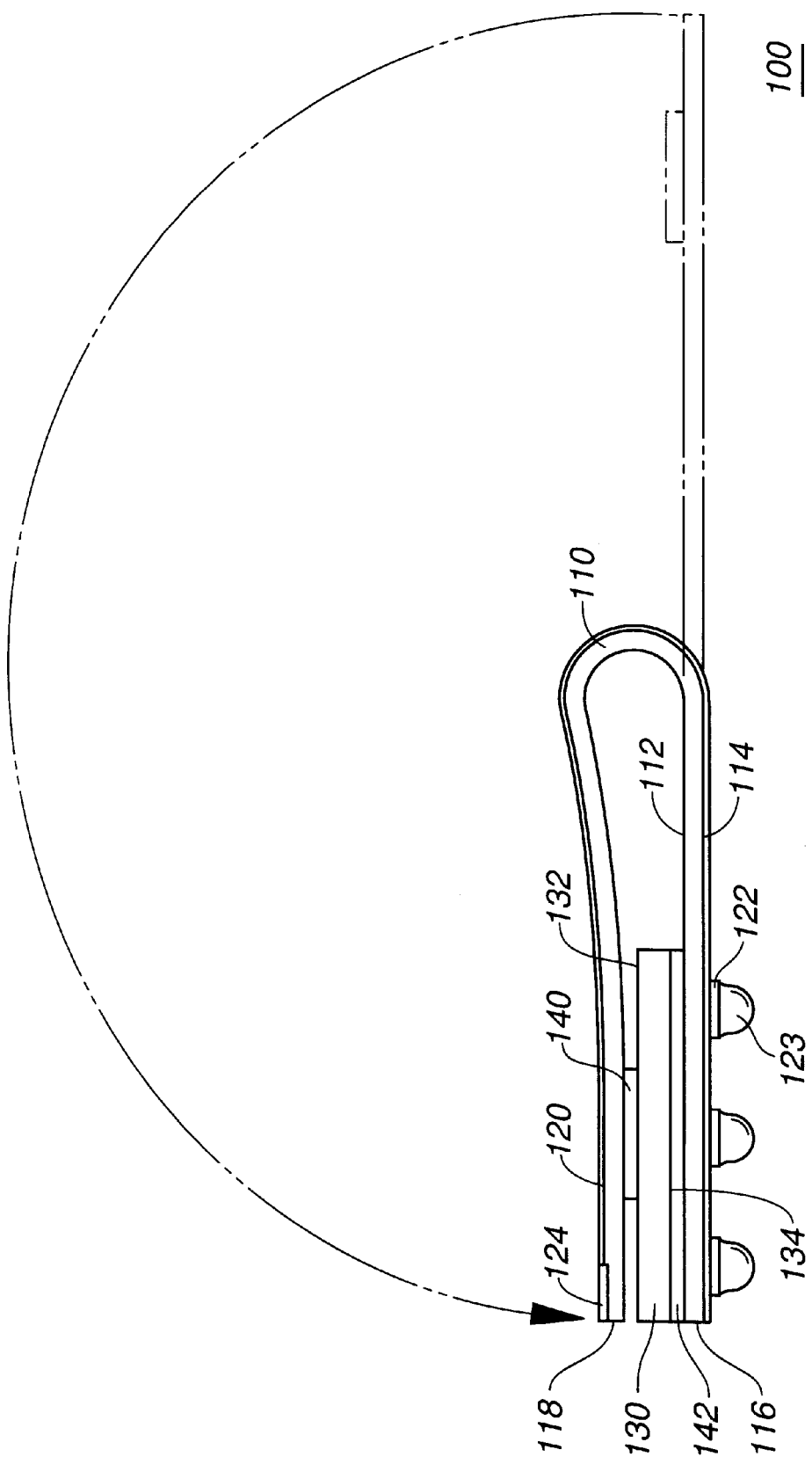
FIG. 1 is a side view of a surface mountable flexible interconnect in accordance with the preferred embodiment of the present invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, a surface mountable flexible interconnection 100 for connecting two electronic subassemblies is shown. The interconnection comprises a flexible film 110 having upper and lower surfaces, 112 and 114, and first and second ends, 116 and 118. The flexible film is typically a polyester or polyimide film, from 0.5 to 10.0 mils in thickness, comparable to what is generally used in the electronics industry for flexible circuitry. A plurality of electrically conductive runners 120 are formed upon the lower surface 114. As one skilled in the art will realize, runners could alternatively be formed on the upper surface 112. Furthermore, runners could be formed on both surfaces, 112 and 114, and connected by conductive through holes, or vias, formed in the flexible film 110. In our preferred embodiment, the runners are copper (optionally plated with materials such as tin-lead alloys, nickel or gold); however, other conductive materials such as aluminum, titanium, or graphite-based inks may also be suitable. Titanium or aluminum are typically sputtered onto the flexible film, whereas the graphite-based inks are typically screen printed. In practice, there are many conductive runners that traverse the film from the first end 116 to the second end 118, and they typically run parallel to each other. Each of the conductive runners has first and second terminal portions, 122 and 124. Preferably, each first terminal portion 122 is a solder pad and has an electrically conductive bump 123 attached to it for subsequent interconnection to the surface of a first subassembly (not shown). Although we envision attaching solder balls to the solder pads, the conductive bump 123 could comprise solder cladding, conductive adhesive, or any of a myriad of other electrically conductive leadless attachment means commonly used in the electronics industry. Typically, the solder pad layout will comprise either a full array or a peripheral array. However, the pad layout may vary without departing from the scope of the invention. The second terminal portion 124 provides a means for mechanically and electrically connecting the second end 118 of the flexible interconnect 100 to a second subassembly (not shown). Depending upon the particular application, the second terminal portion 124 may be attached with the aid of an electrically conductive medium (e.g., soldering to a PCB, heat sealing to a liquid crystal display, etc.) or directly connected without the aid of a medium (e.g., direct insertion into the receiving portion of a zero insertion force (ZIF) component). Given the variety of potential applications, the second terminal portion 124 could embody any of a number of different configurations (e.g., a metal finger, solder pad, pin, etc.).

Still referring to FIG. 1, a rigid member 130 is fixedly attached to the flexible film upper surface 112 proximate to the first end 116. In the preferred embodiment, the rigid member 130 is a laminated sheet, similar to that commonly used as a PCB material. Indeed, we have found that common epoxy-glass or polyimide-glass circuit board laminate without the copper cladding functions well as a rigid member. Other materials such as injection molded plastic or stamped metal are viable alternatives. The rigid member 130 acts as a flexible film rigidizer, reducing stresses at the interface between each solder pad 122 and solder ball 123. Stresses may be further minimized by choosing a rigid member material having a coefficient of thermal expansion (CTE) similar to that of the underlying flexible film 110. In our preferred embodiment, the lower surface 134 of the rigid member 130 is attached to the flexible film upper surface 112 by means of a high-tack pressure sensitive adhesive 142. Here, the term "high-tack" refers to an adhesive having a sufficiently high adhesive strength to keep the rigid member permanently affixed to the flexible film. For example, we have found success with a commercially-available adhesive which is referred to by product number F-9469PC and is manufactured by 3M Corporation. The adhesive 142 should also have a sufficient temperature resistance to survive typical solder reflow temperatures without degrading. A low-tack pressure sensitive adhesive 140 is disposed upon the flexible film upper surface 112 proximate to the second end 118. The flexible film second end 118 is folded back over the first end 116 such that the flexible film upper surface 112 is attached to the rigid member upper surface 132 by means of the low tack adhesive 142. In this configuration, the flexible interconnect 100 may be efficiently packaged for use on automated manufacturing line. For example, the interconnect 100 could be supplied in a tape-and-reel format. As used in this application, the term "low-tack" refers to an adhesive whose adhesive strength (or tackiness)—although sufficient to maintain temporary attachment between the flexible film upper surface 112 and the rigid member upper surface 132 during packaging and pick-and-place operations—is low enough to be manually detached without affecting the integrity of the interconnect 100. Again, we have found success with an adhesive from 3M Corporation which is referred to by its product number F-9464. Obviously, the low-tack adhesive 140 could be disposed upon the rigid member upper surface 132 (instead of the flexible film upper surface 112) before attachment of the film to the rigid member.

Figure 2:
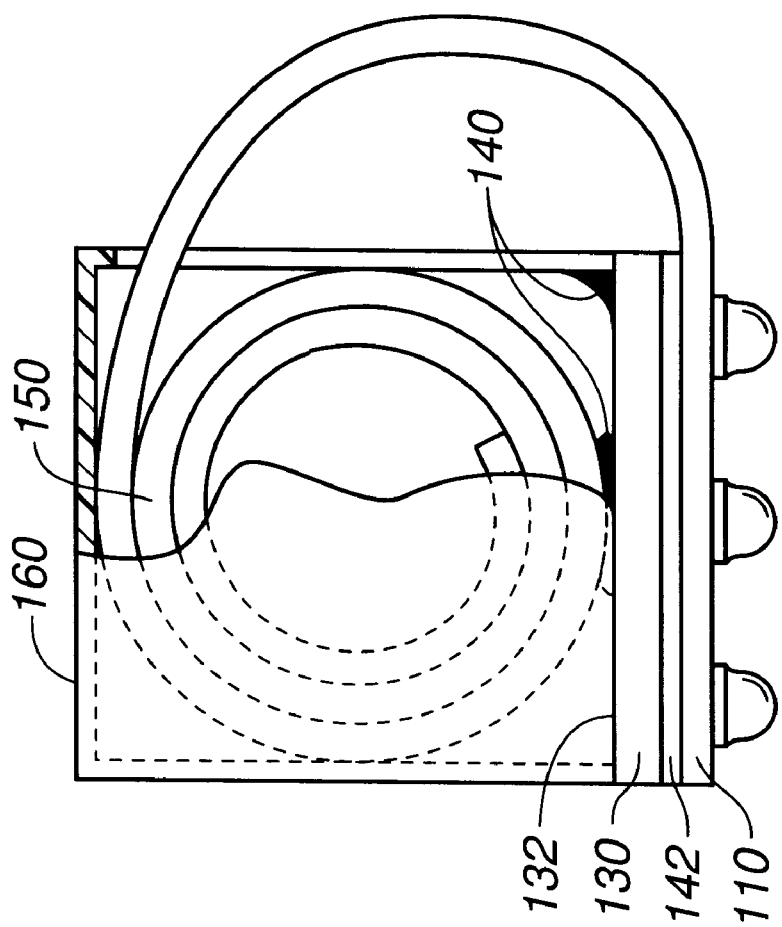
FIG. 2 is a side view of a surface mountable flexible interconnect having a rolled-up portion of flexible film, in accordance with an alternate embodiment of the present invention.

Referring now to FIG. 2, an alternate embodiment of the invention has a rolled portion 150 of flexible film attached to the rigid member upper surface 132 by means of a low-tack adhesive 140. A header 160 containing the rolled portion 150 is attached to the rigid member upper surface 132 by means of a low-tack pressure sensitive adhesive 140. This embodiment enables the interconnect 100 to be efficiently packaged in a compact configuration, and is particularly advantageous in instances where a lengthy interconnect is required. In addition to preventing the rolled portion 150 of the flexible film from unraveling, the flat top surface of the header 160 provides a planar contact surface for a pick-and-place nozzle (not shown). After the flexible interconnect 100 has been placed upon, and attached to, a first subassembly (not shown) the header may be removed and the rolled portion 150 unrolled to allow attachment of the second terminal portion 124 to a second subassembly (not shown).

Figure 3:
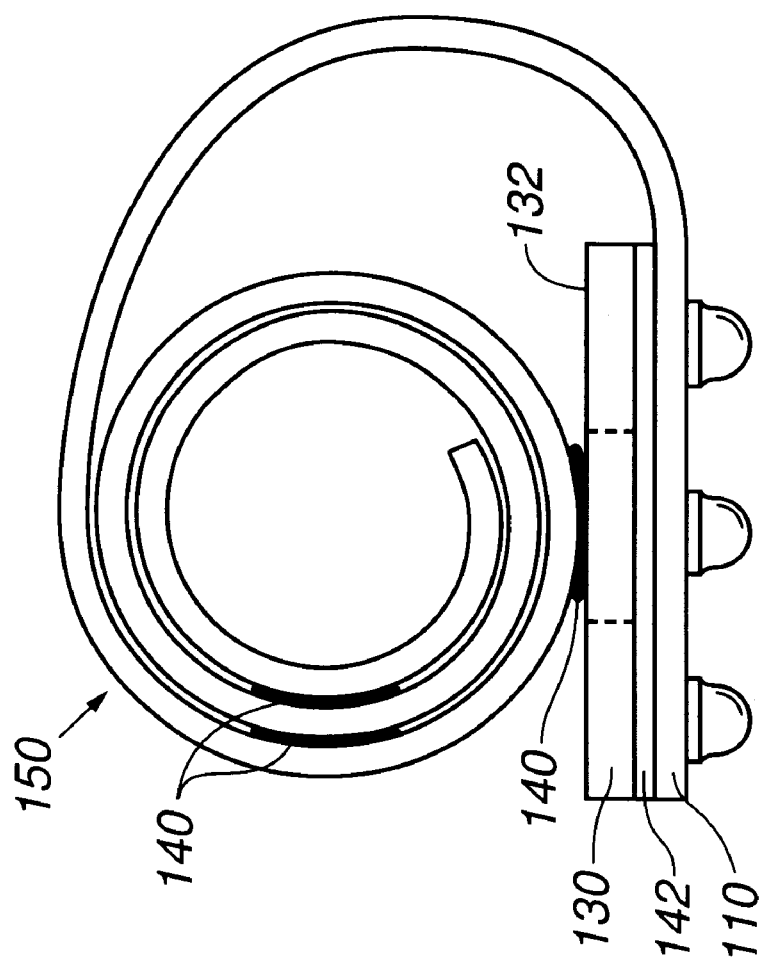
FIG. 3 is a side view of a further embodiment of the present invention, illustrating a surface mountable flexible interconnect incorporating integral tabs for component pickup.
Figure 4:
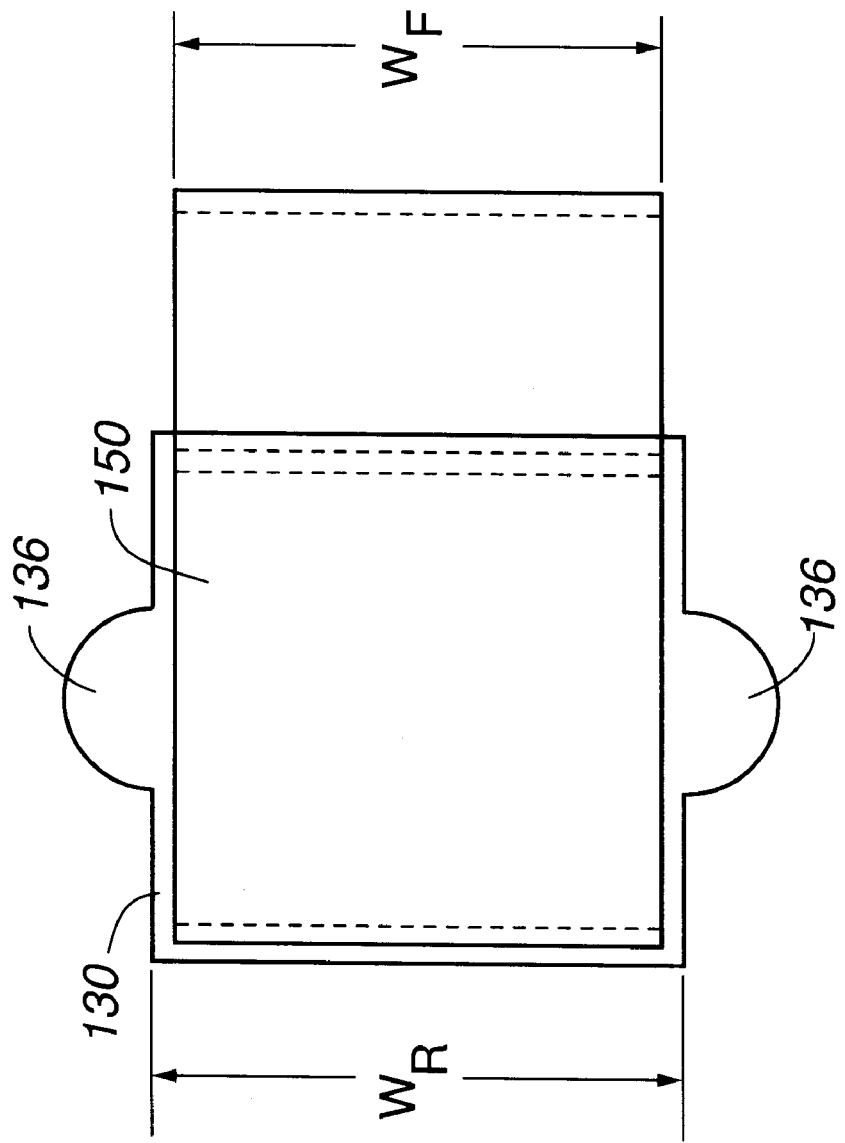
FIG. 4 is a top plan view of the surface mountable flexible interconnect depicted in FIG. 3.

Referring now to FIGS. 3 and 4, a further embodiment of the invention incorporates a rolled portion 150 of flexible film which is held in place solely with the use of adhesive. Here, the rolled portion 150 is attached to the rigid member upper surface 132 by means of a low-tack pressure sensitive adhesive 140. Additional adhesive 140 may be partially disposed between interfacing surfaces of the rolled portion 150, to provide added stability, i.e., to prevent unraveling of the rolled portion. In this embodiment, the rigid member 130 has integral tabs 136 extending beyond the width, $W_F$, of the flex film to provide a contact surface for pick-and-place operations. For example, we envision the use of a pick-and-place nozzle having two prongs, each prong for contacting a single tab 136. It will occur to one skilled in the art that a similar embodiment, without the tabs 136, could be incorporated in instances where the difference between the width of the rigid element, $W_R$, and the width of the flexible film, $W_F$, results in a sufficient surface area around the periphery of the rigid element for nozzle contact.

Figure 5:
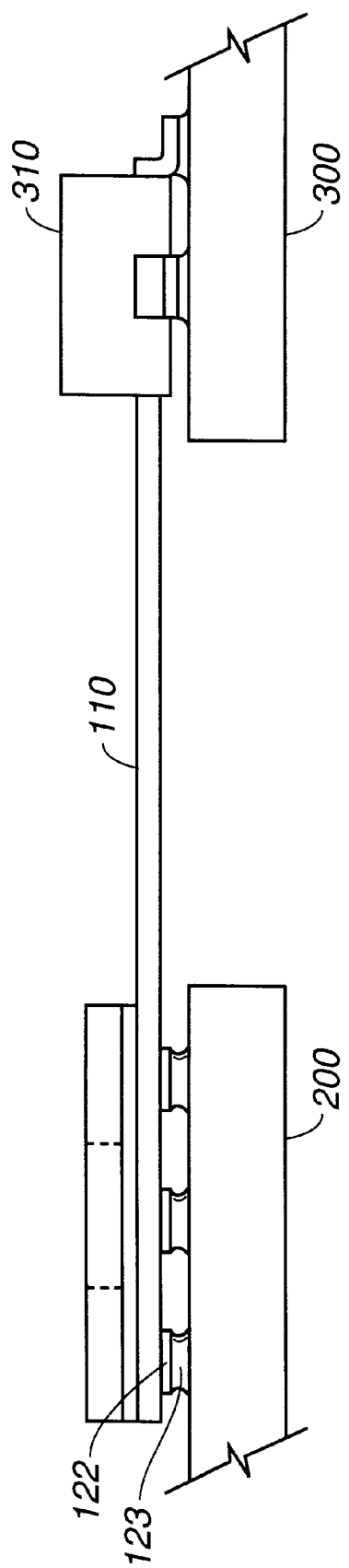
FIG. 5 is a side view of a surface mountable flexible interconnect providing an electrical conduit between two isolated electronic subassemblies, in accordance with the preferred embodiment of the present invention.

Referring now to FIG. 5, the flexible interconnect 110 is used to electrically connect two individual subassemblies, 200 and 300. Initially, the first end 116 of the flexible interconnect 110 is attached to the first subassembly 200. Typically, solder balls 123 attached to the first terminal portions 122 are reflowed to interconnection pads on a receiving surface of the first subassembly 200. With the first end 116 of the interconnect 100 attached to the first subassembly 200, the second terminal portion 124 may be electrically connected to the second subassembly 300. In some instances, the second terminal portion 124 may be directly connected to a receiving surface of the subassembly 300; in other instances, the second terminal portion may be connected to a component 310 (e.g., a ZIF connector) disposed upon the receiving surface. Our surface mountable flexible interconnect affords greatly improved flexibility over existing interconnect devices. In particular, since interconnection to the individual subassemblies does not have to be performed simultaneously, there is no need for the subassemblies to be situated side-by-side during the manufacturing process. Instead, the flexible interconnect may be attached to the first subassembly 200 on a single manufacturing line and later attached to the second subassembly 300.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A surface mountable flexible interconnect structure, comprising:

a flexible film having upper and lower opposing surfaces, first and second ends, and a plurality of electrically conductive runners formed on the lower surface, each runner having a first and a second terminal portion, the first terminal portion comprising an interconnection pad having a solder bump affixed thereto;

a rigid member fixedly attached to the flexible film upper surface proximate to the first end; and the second end of the flexible film folded back toward the first end and removably attached to the upper surface of the rigid member by a low-tack pressure sensitive adhesive, such that the second end may be subsequently detached from the rigid member.

2. The flexible interconnect structure as described in claim 1, wherein said flexible film is polyester or polyimide.

3. The flexible interconnect structure as described in claim 1, wherein said rigid member is injection molded directly to the flexible film upper surface.

4. The flexible interconnect structure as described in claim 1, wherein said rigid member is a laminated sheet fixedly attached to the flexible film upper surface by means of a high-tack pressure sensitive adhesive disposed between said laminated sheet and said flexible film.

5. The flexible interconnect structure as described in claim 1, wherein the electrically conductive runners are copper or graphite-based conductive ink.

6. The flexible interconnect structure as described in claim 1, wherein the second terminal portion comprises a pad, a finger, a pin, or a conductive adhesive.

7. A surface mountable flexible interconnect structure, comprising:

a flexible film having upper and lower opposing surfaces, first and second ends, and a plurality of electrically conductive runners formed on the lower surface, each runner having a first and a second terminal portion, the first terminal portion comprising an interconnection pad having an electrically conductive bump affixed thereto; and a rigid member fixedly attached to the flexible film upper surface proximate to the first end, wherein the second end is inwardly-rolled toward the flexible film upper surface and a resulting rolled portion of the flexible film is attached to an upper surface of the rigid member by means of a low-tack pressure sensitive adhesive.

8. The flexible interconnect structure as described in claim 7, further comprising a cover for containing the rolled portion of the flexible film, the cover is attached to the rigid member upper surface by means of low-tack pressure sensitive adhesive.

9. The flexible interconnect structure as described in claim 7, further comprising low-tack pressure sensitive adhesive partially disposed between interfacing surfaces of the rolled portion of the flexible film.

10. The flexible interconnect structure as described in claim 7, wherein said rigid member has tab portions extending beyond the width of the rolled portion of the flexible film.

11. The flexible interconnect structure as described in claim 7, wherein the flexible film is polyester or polyimide.

12. The flexible interconnect structure as described in claim 7, wherein the rigid member is injection molded directly to the flexible film upper surface.

13. The flexible interconnect structure as described in claim 7, wherein said rigid member is a laminated sheet fixedly attached to the flexible film upper surface by means of a high-tack pressure sensitive adhesive disposed between the laminated sheet and the flexible film.

14. The flexible interconnect structure as described in claim 7, wherein said electrically conductive bump is a solder bump.

15. The flexible interconnect structure as described in claim 7, wherein the electrically conductive runners are copper or graphite-based conductive ink.

16. The flexible interconnect structure as described in claim 7, wherein the second terminal portion comprises a pad, a finger, a pin, or a conductive adhesive.

17. A surface mountable flexible interconnect structure, comprising:

a flexible film having upper and lower opposing surfaces, first and second ends, and a plurality of electrically conductive runners formed on the lower surface, each runner having a first and a second terminal portion, the first terminal portion comprising a solder pad having a solder ball affixed thereto;

a rigid member having upper and lower surfaces, the rigid member lower surface fixedly attached to a portion of the flexible film upper surface proximate to the first end by means of a high-tack pressure sensitive adhesive; and a low-tack pressure sensitive adhesive temporarily attaching a portion of the flexible film upper surface proximate to the second end to the rigid member lower surface, such that said portion of the flexible film upper surface proximate to the second end may be subsequently detached from the rigid member.

* * * * *